United States Patent
Lee et al.

(10) Patent No.: US 11,906,900 B2
(45) Date of Patent: Feb. 20, 2024

(54) CHEMICALLY AMPLIFIED POSITIVE PHOTORESIST COMPOSITION FOR IMPROVING PATTERN PROFILE

(71) Applicant: YOUNG CHANG CHEMICAL CO., LTD, Gyeongsangbuk-do (KR)

(72) Inventors: Su Jin Lee, Daegu (KR); Young Cheol Choi, Gumin-si (KR); Seung Hun Lee, Daegu (KR); Seung Hyun Lee, Daegu (KR)

(73) Assignee: YOUNG CHANG CHEMICAL CO., LTD, Gyeongsangbuk-do (KR)

( * ) Notice: Subject to any disclaimer, the term of this patent is extended or adjusted under 35 U.S.C. 154(b) by 657 days.

(21) Appl. No.: 15/734,140

(22) PCT Filed: May 22, 2019

(86) PCT No.: PCT/KR2019/006128
§ 371 (c)(1),
(2) Date: Dec. 1, 2020

(87) PCT Pub. No.: WO2019/245172
PCT Pub. Date: Dec. 26, 2019

(65) Prior Publication Data
US 2021/0216013 A1   Jul. 15, 2021

(30) Foreign Application Priority Data
Jun. 18, 2018 (KR) .................. 10-2018-0069664

(51) Int. Cl.
G03F 7/039 (2006.01)
G03F 7/004 (2006.01)

(52) U.S. Cl.
CPC .......... *G03F 7/0392* (2013.01); *G03F 7/0045* (2013.01)

(58) Field of Classification Search
None
See application file for complete search history.

(56) References Cited

U.S. PATENT DOCUMENTS

| | | | | |
|---|---|---|---|---|
| 5,364,738 A | * | 11/1994 | Kondo | G03F 7/016 430/326 |
| 5,744,281 A | * | 4/1998 | Niki | G03F 7/0045 430/179 |
| 2008/0206670 A1 | * | 8/2008 | Shiraishi | B41C 1/1008 430/270.1 |
| 2010/0203447 A1 | * | 8/2010 | Otsuka | G03F 7/0397 430/325 |
| 2011/0183262 A1 | * | 7/2011 | Kusaki | G03F 7/2041 430/326 |
| 2011/0294069 A1 | * | 12/2011 | Bae | G03F 7/16 430/311 |
| 2015/0355543 A1 | * | 12/2015 | Takemura | G03F 7/20 430/326 |

FOREIGN PATENT DOCUMENTS

| | | | | |
|---|---|---|---|---|
| EP | 1008909 A1 | * | 6/2000 | ........... G03F 7/0047 |
| JP | 06194840 A | * | 7/1994 | |
| JP | 2004117959 A | * | 4/2004 | |
| JP | 2014143415 A | * | 8/2014 | ............ G03F 7/091 |
| KR | 10-0273108 B1 | | 3/2001 | |
| KR | 10-2005-0003604 A | | 1/2005 | |
| KR | 10-2007-0010838 A | | 1/2007 | |
| KR | 10-2010-0047038 A | | 5/2010 | |
| KR | 10-2011-0124099 A | | 11/2011 | |
| KR | 10-1204915 B1 | | 11/2012 | |
| KR | 10-1363842 B1 | | 2/2014 | |
| KR | 10-1655947 B1 | | 9/2016 | |
| KR | 10-2017-0128709 A | | 11/2017 | |
| KR | 10-1977886 B1 | | 5/2019 | |

* cited by examiner

*Primary Examiner* — Martin J Angebrandt
(74) *Attorney, Agent, or Firm* — NKL LAW; Jae Youn Kim

(57) ABSTRACT

Proposed is a photoresist composition for a KrF light source, which exhibits a vertical profile compared to conventional KrF positive photoresists by adding a resin capable of increasing transmittance in order to form a semiconductor pattern, particularly a chemically amplified positive photoresist composition for improving a pattern profile, which includes, based on the total weight of the composition, 5 to 60 wt % of a polymer resin, 0.1 to 10 wt % of a transmittance-increasing resin additive represented by Chemical Formula 1, 0.05 to 10 wt % of a photoacid generator, 0.01 to 5 wt % of an acid diffusion inhibitor, and the remainder of a solvent, thus making it possible to provide a composition exhibiting a vertical profile, enhanced sensitivity and a superior processing margin compared to conventional positive photoresists.

4 Claims, No Drawings

CHEMICALLY AMPLIFIED POSITIVE PHOTORESIST COMPOSITION FOR IMPROVING PATTERN PROFILE

TECHNICAL FIELD

The present disclosure relates to a chemically amplified positive photoresist composition for improving a pattern profile.

BACKGROUND ART

With the recent demand to reduce the size and increase the degree of integration of semiconductor devices through the development of semiconductor manufacturing technology, techniques for forming ultrafine patterns having line widths corresponding to tens of nm or less are required. Advances in techniques for forming ultrafine patterns have been made through the use of light sources having smaller wavelengths and through the development of processing technology and photoresists suitable for such light sources.

A photoresist is used for photolithography for forming a variety of patterns. The term "photoresist" refers to a photosensitive resin, the solubility of which varies in a developing solution due to the action of light, to thus obtain an image corresponding to the exposure pattern.

The formation of a photoresist pattern includes negative tone development (NTD) using a negative tone developing solution and positive tone development (PTD) using a positive tone developing solution.

The process of forming a pattern through NTD includes selectively dissolving and removing an unexposed region using a negative tone developing solution, and the process of forming a pattern through PTD includes selectively dissolving and removing an exposed region using a positive tone developing solution.

Compared to pattern formation using PTD, pattern formation using NTD enables the formation of a reverse-phase pattern in a contact-hole pattern or a trench pattern, which is considered to be difficult to form due to insufficient exposure, thereby making it easy to consistently form a pattern. Furthermore, an organic solvent is used as the developing solution for removing the unexposed portion, thereby more effectively forming a photoresist pattern.

Meanwhile, a typical photolithography process using a photoresist composition includes coating a wafer with a photoresist, performing soft baking for heating the coated photoresist to evaporate the solvent, forming an image by means of a light source passed through a photomask, forming a pattern through a difference in solubility between an exposed portion and an unexposed portion using a developing solution, and completing a circuit through etching.

The photoresist composition may be exemplified by a composition composed of a photosensitive agent (a photoacid generator) for generating an acid through excimer laser irradiation, a base resin, and other additives. The base resin, configured such that a phenol structure contains a hydroxyl group, typically includes a polystyrene polymer, and any photosensitive agent may be used, so long as it is able to generate an acid ($H^+$) at a specific wavelength, and main examples thereof may include sulfonium-salt-based materials, sulfonyl-diazo-based materials, benzosulfonyl-based materials, iodine-based materials, chlorine-based materials, carboxylic-acid-based materials and the like.

Also, the light source mainly used for the above process has a wavelength in a range from 193 nm to 365 nm, and examples thereof include an I-ray, a KrF excimer laser, and an ArF excimer laser. As is known in the art, the shorter the wavelength, the finer the pattern.

In particular, thorough research into a KrF laser (248 nm) photoresist for photo microprocessing is ongoing despite the development of an ArF laser (193 nm) system. This is because the development of next-generation ArF photoresists is still unsatisfactory, and also because the use of a KrF photoresist may greatly reduce the cost of mass production of semiconductors. Accordingly, the performance of a KrF photoresist has to be improved in order to support such technical development, and, for example, the thickness of the photoresist is required to decrease with an increase in the degree of integration. Hence, the development of a photoresist in which dry etching resistance is further increased is urgently required. In addition thereto, there are requirements for high resolution, a wide DOF (depth of focus) margin, defect-free thin film formation, adhesion to a substrate, high contrast, fast sensitivity chemical stability, and the like.

Conventional techniques pertaining to the photoresist for a KrF laser include Korean Patent Application Publication No. 10-2010-0047038 「Chemically amplified positive photoresist composition」, Korean Patent No. 10-1363842 「Chemically amplified positive photoresist composition and method of forming resist pattern using the same」, Korean Patent No. 10-1204915 「Photoresist polymer, photoresist composition comprising the same, and method of forming pattern of photoresist using the same」, Korean Patent No. 10-0273108 「Copolymer for preparing photoresist and chemically amplified positive photoresist composition containing the same」, Korean Patent No. 10-1655947 「Negative photoresist composition for KrF laser having high resolution and high aspect ratio」, and the like.

As disclosed in the aforementioned patents, a photoresist for KrF is mainly composed of, as base polymers, polyhydroxystyrene and polystyrene polymers having good transmittance at a wavelength of 248 nm in order to increase resolution and sensitivity.

The positive photoresist mainly including such polyhydroxystyrene and polystyrene polymers causes a sloped pattern or a footing phenomenon, so the range thereof usable in a process based on a light source of 248 nm is limited, making it difficult to perform processing.

CITATION LIST

Patent Literature (Patent Document 1) Korean Patent Application Publication No. 10-2010-0047038
(Patent Document 2) Korean Patent No. 10-1363842
(Patent Document 3) Korean Patent No. 10-1204915
(Patent Document 4) Korean Patent No. 10-0273108
(Patent Document 5) Korean Patent No. 10-1655947

DISCLOSURE

Technical Problem

An objective of the present disclosure is to provide a photoresist composition for a KrF light source, which includes a resin capable of increasing transmittance and thus exhibits a vertical profile compared to conventional KrF positive photoresists.

Technical Solution

In order to accomplish the above objective, the present disclosure provides a positive photoresist composition for a KrF laser including a transmittance-increasing resin additive for a chemically amplified resist having a weight average molecular weight of 2,000 to 20,000, as represented by Chemical Formula 1 below.

[Chemical Formula 1]

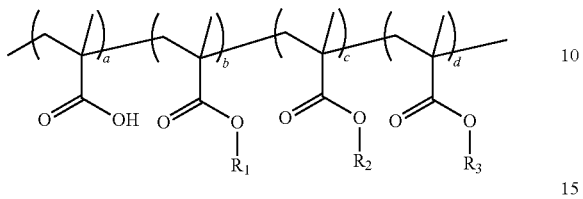

Here, a, b, c, and d are molar ratios of repeating units constituting a copolymer, and are each 1 to 9. In the above structure, $R_1$, $R_2$, and $R_3$ are at least one selected from among methyl (R—$CH_3$), ethyl (R—$CH_2CH_3$), propyl (R—$CH_2CH_2CH_3$), butyl (R—$CH_2CH_2CH_2CH_3$) and combinations thereof, and are different from each other, R being a binding site.

In a preferred embodiment of the present disclosure, the transmittance-increasing resin additive for a resist as represented by the above Chemical Formula and the similar structure are commercially available from domestic and foreign suppliers, such as Miwon, Meiwa and the like.

In a preferred embodiment of the present disclosure, the polymer additive for a resist as represented by Chemical Formula 1 may have a weight average molecular weight of 2,000 to 20,000.

In a preferred embodiment of the present disclosure, the positive photoresist composition including the transmittance-increasing resin additive for a resist may include, based on the total weight of the composition, 5 to 60 wt % of a polymer resin, 0.1 to 10 wt % of the transmittance-increasing resin additive represented by Chemical Formula 1, 0.05 to 10 wt % of a photoacid generator, 0.01 to 5 wt % of an acid diffusion inhibitor, and the remainder of a solvent.

In a preferred embodiment of the present disclosure, the polymer resin may be used without limitation, so long as it is a typical photoresist resin, and is at least one selected from the group consisting of hydroxyl-group-containing phenol polymer resins represented by Chemical Formula 2 to Chemical Formula 5 below.

Resin comprising

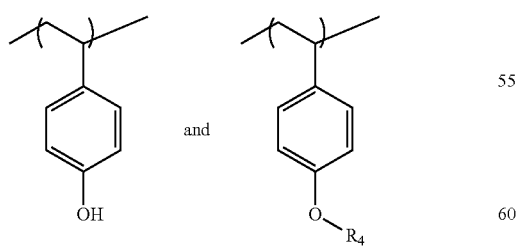

repeating units (in which $R_4$ is any one structure selected from among structures represented by Chemical Formula a to Chemical Formula p below, and R is a binding site)

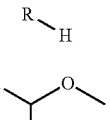

[Chemical Formula a]

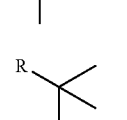

[Chemical Formula b]

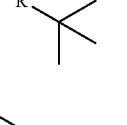

[Chemical Formula c]

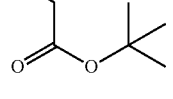

[Chemical Formula d]

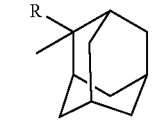

[Chemical Formula e]

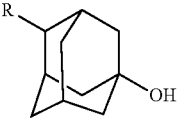

[Chemical Formula f]

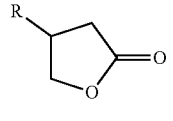

[Chemical Formula g]

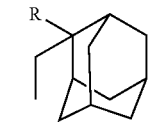

[Chemical Formula h]

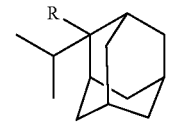

[Chemical Formula i]

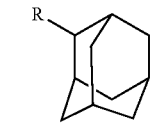

[Chemical Formula j]

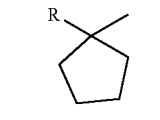

[Chemical Formula k]

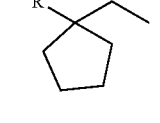

[Chemical Formula l]

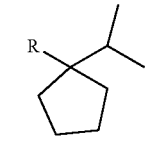

[Chemical Formula m]

-continued

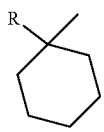

[Chemical Formula n]

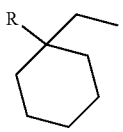

[Chemical Formula o]

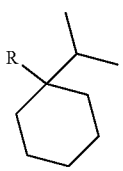

[Chemical Formula p]

Resin comprising

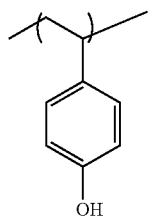 and 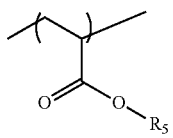

repeating units (in which $R_5$ is identical to $R_4$ and is any one structure selected from among structures represented by Chemical Formula a to Chemical Formula p)

Resin comprising

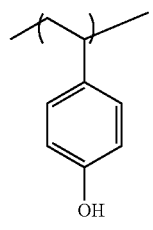, 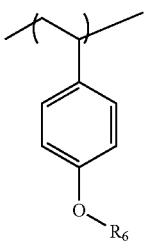 and 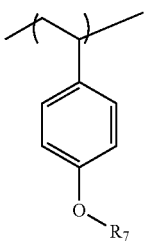

repeating units (in which $R_6$ and $R_7$ are one or more structures selected from among structures represented by Chemical Formula a to Chemical Formula p)

Resin comprising

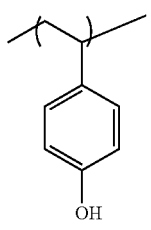, 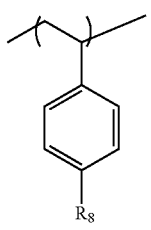 and 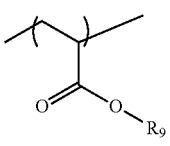

repeating units (in which $R_8$ and $R_9$ are one or more structures selected from among structures represented by Chemical Formula a to Chemical Formula p)

In a preferred embodiment of the present disclosure, the phenol polymer resin may be at least one selected from the group consisting of hydroxyl-group-containing phenol polymer resins represented by Chemical Formula 2 to Chemical Formula 5.

In a preferred embodiment of the present disclosure, the photoacid generator may include at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzylsulfonate, pyrogallol tris(alkyl sulfonate), norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

In a preferred embodiment of the present disclosure, the acid diffusion inhibitor may include at least one selected from the group consisting of dimethylamine, diethylamine, trimethylamine, triethylamine, tributylamine, dimethanolamine, diethanolamine, trimethanolamine, triethanolamine, and tributanolamine.

Advantageous Effects

According to the present disclosure, a chemically amplified positive photoresist composition includes a transmittance-increasing resin additive, thus obtaining a vertical profile depending on the exposure energy and also increasing sensitivity, thereby improving a processing margin compared to conventional KrF photoresists.

BEST MODE

Unless otherwise defined, all technical and scientific terms used herein have the same meanings as those typically understood by those skilled in the art to which the present invention belongs. Generally, the nomenclature used herein is well known in the art and is typical.

As used herein, when any part "comprises" or "includes" any element, this does not mean that other elements are excluded, and such other elements may be further included unless otherwise specifically mentioned.

As used herein, the term "photoresist" refers to a mixture comprising a polymer and a photosensitive agent, the chemical properties of which change upon radiation of light thereto, thus altering the solubility thereof in a specific solvent when exposed to light of any wavelength, whereby an undissolved portion is left behind to thus form a pattern after the duration of a predetermined dissolution time due to the difference in dissolution rate in the solvent between an exposed portion and an unexposed portion.

As used herein, the term "photolithography" means that, when a mask having a semiconductor circuit design is disposed between a light source and a photoresist layer applied on a silicon wafer and the light source is turned on, the circuit of the mask is transferred onto the photoresist using the properties of the photoresist.

As used herein, the term "KrF laser" refers to a krypton fluoride (KrF) laser having a wavelength of 248 nm.

An embodiment of the present disclosure pertains to a chemically amplified positive photoresist composition for improving a pattern profile including a transmittance-increasing resin additive represented by Chemical Formula 1 below.

[Chemical Formula 1]

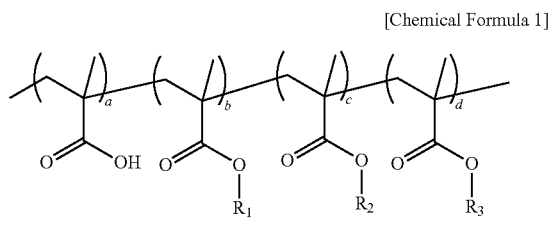

Here, a, b, c, and d are molar ratios of repeating units constituting a copolymer, and are each 1 to 9. In the above structure, $R_1$, $R_2$, and $R_3$ are at least one selected from among methyl (R—$CH_3$), ethyl (R—$CH_2CH_3$), propyl (R—$CH_2CH_2CH_3$), butyl (R—$CH_2CH_2CH_2CH_3$) and combinations thereof, and are different from each other, R being a binding site.

The positive photoresist composition for improving a pattern profile including the transmittance-increasing resin additive according to the present disclosure may include, based on the total weight of the composition, 5 to 60 wt % of a polymer resin, 0.1 to 10 wt % of the transmittance-increasing resin additive represented by Chemical Formula 1, 1 to 10 wt % of a crosslinking agent, 0.05 to 10 wt % of a photoacid generator, 0.01 to 5 wt % of an acid diffusion inhibitor, and the remainder of a solvent.

The amount of the transmittance-increasing resin additive represented by Chemical Formula 1 is preferably 0.1 to 10 wt % based on the total weight of the composition. If the amount thereof is less than 0.1 wt %, the amount of the transmittance-increasing resin additive is too small to ensure a vertical profile. On the other hand, if the amount thereof exceeds 10 wt %, a vertical profile may be ensured but defects such as scum, poor etching resistance and development defects may be caused thereby, which is undesirable.

The polymer resin may be used without limitation, so long as it is a typical photoresist resin, and is at least one selected from the group consisting of hydroxyl-group-containing phenol polymer resins represented by Chemical Formula 2 to Chemical Formula 5 below.

[Chemical Formula 2]
Resin comprising

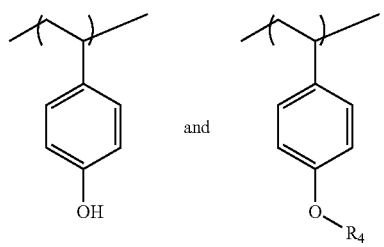

repeating units (in which $R_4$ is any one structure selected from among structures represented by Chemical Formula a to Chemical Formula p below, and R is a binding site)

-continued

[Chemical Formula m]
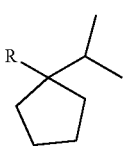

[Chemical Formula n]
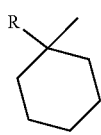

[Chemical Formula o]
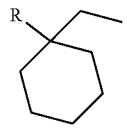

[Chemical Formula p]
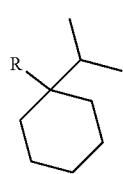

[Chemical Formula 3]
Resin comprising

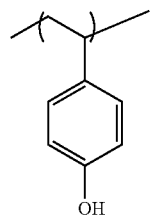 and 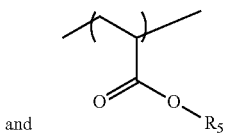

repeating units (in which $R_5$ is identical to $R_4$ and is any one structure selected from among structures represented by Chemical Formula a to Chemical Formula p)

[Chemical Formula 4]
Resin comprising

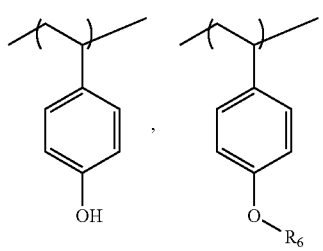, 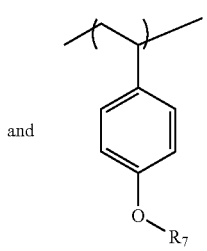

repeating units (in which $R_6$ and $R_7$ are one or more structures selected from among structures represented by Chemical Formula a to Chemical Formula p)

[Chemical Formula 5]
Resin comprising

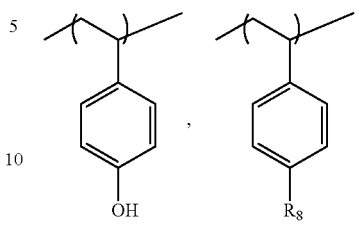 and 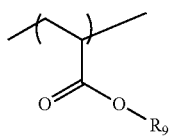

repeating units (in which $R_8$ and $R_9$ are one or more structures selected from among structures represented by Chemical Formula a to Chemical Formula p)

In a preferred embodiment of the present disclosure, the phenol polymer resin may be at least one selected from the group consisting of hydroxyl-group-containing phenol polymer resins represented by Chemical Formula 2 to Chemical Formula 5.

The amount of the polymer resin is preferably 5 to 60 wt % based on the total weight of the composition. If the amount of the polymer resin is less than 5 wt %, problems such as a poor profile, scum, poor etching resistance and the like may occur. On the other hand, if the amount thereof exceeds 60 wt %, poor patterning may occur due to insufficient development.

The photoacid generator may include at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzylsulfonate, pyrogallol tris(alkyl sulfonate), norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

The amount of the photoacid generator is preferably 0.05 to 10 wt % based on the total weight of the composition. If the amount of the photoacid generator is less than 0.05 wt %, the pattern slope may become severe due to insufficient generation of acid. On the other hand, if the amount thereof exceeds 10 wt %, the photoacid generator may absorb the light of the exposure source to thus decrease transmittance, making it difficult to clearly define the pattern and thus causing pattern defects.

The acid diffusion inhibitor may include at least one selected from the group consisting of dimethylamine, diethylamine, trimethylamine, triethylamine, tributylamine, dimethanolamine, diethanolamine, trimethanolamine, triethanolamine, and tributanolamine.

The amount of the acid diffusion inhibitor is 0.01 to 5 wt % based on the total weight of the composition. If the amount of the acid diffusion inhibitor is less than 0.01 wt %, pattern defects in which the wall or edge of the pattern deteriorates (LWR, LER) owing to excessive acid generation may occur. On the other hand, if the amount thereof exceeds 5 wt %, pattern formation may become impossible.

Meanwhile, the thickness of the chemically amplified positive photoresist composition for improving a pattern profile including the transmittance-increasing resin additive according to the present disclosure may fall in the range of 2,000 Å to 200,000 Å depending on the type and amount of solvent that is used, and such a positive photoresist composition may be dissolved in an amount of 10 to 90 wt % relative to the weight of the solvent, and may then be used.

Examples of the solvent may include ethyleneglycol monomethylether, ethyleneglycol monoethylether, methylcellosolve acetate, ethylcellosolve acetate, diethyleneglycol monomethylether, diethyleneglycol monoethylether, propyleneglycol monomethylether, propyleneglycol methyl ether acetate, propyleneglycol propyl ether acetate, diethyleneglycol dimethylether, ethyl lactate, toluene, xylene, methylethylketone, cyclohexanone, 2-heptanone, 3-heptanone, and 4-heptanone, which may be used alone or in combination.

As described above, the chemically amplified positive photoresist composition for improving a pattern profile including the transmittance-increasing resin additive according to the present disclosure includes the transmittance-increasing resin additive represented by Chemical Formula 1, and is thus capable of providing a photoresist composition enabling the formation of a vertical profile suitable for use in the process of manufacturing a semiconductor, thereby conferring a superior processing margin.

MODE FOR DISCLOSURE

Examples

A better understanding of the present disclosure will be given through the following examples. These examples are merely set forth to illustrate the present disclosure, and are not to be construed as limiting the scope of the present disclosure, as will be apparent to those skilled in the art.

Example 1

A positive photoresist composition for a KrF excimer laser was prepared by mixing 100 g of a phenol polymer resin having a weight average molecular weight of 15,000 (in Chemical Formula 5, $R_8$ is Chemical Formula a, $R_9$ is Chemical Formula c, and respective copolymerization ratios 1, m, and n are 7, 2, and 1) as a base resin, 0.25 g of a transmittance-increasing resin additive having a weight average molecular weight of 17,000 (in Chemical Formula 1, $R_1$, $R_2$, and $R_3$ are methyl, propyl, and butyl, respectively, and respective copolymerization ratios a, b, c, and d are 20, 50, 15, and 15), 4 g of triphenylsulfonium nonaflate as a photoacid generator, 0.6 g of triethanolamine as an acid diffusion inhibitor, and a solvent mixture comprising 104 g of propylene glycol monomethylether and 104 g of propylene glycol methyl ether acetate. The composition thus prepared was applied on a silicon wafer using a spin coater and soft-baked at 140° C. for 90 sec, after which a desired thickness of 10 μm was confirmed. An exposure process was performed using a light source at 248 nm, followed by a baking process at 110° C. for 80 sec and then a development process using 2.38% tetramethylammonium hydroxide, thus forming a pattern. The pattern thus formed was confirmed to be a positive slope pattern having a sensitivity of 100 mJ/cm², a line/space resolution of 3.0 μm, and a pattern slope angle of 75°.

Example 2

A positive photoresist composition for a KrF excimer laser was prepared by mixing 100 g of a phenol polymer resin having a weight average molecular weight of 15,000 (in Chemical Formula 5, $R_8$ is Chemical Formula a, $R_9$ is Chemical Formula c, and respective copolymerization ratios 1, m, and n are 7, 2, and 1) as a base resin, 1.5 g of a transmittance-increasing resin additive having a weight average molecular weight of 17,000 (in Chemical Formula 1, $R_1$, $R_2$, and $R_3$ are methyl, propyl, and butyl, respectively, and respective copolymerization ratios a, b, c, and d are 20, 50, 15, and 15), 4 g of triphenylsulfonium nonaflate as a photoacid generator, 0.6 g of triethanolamine as an acid diffusion inhibitor, and a solvent mixture comprising 105 g of propylene glycol monomethylether and 105 g of propylene glycol methyl ether acetate. The composition thus prepared was applied on a silicon wafer using a spin coater and soft-baked at 140° C. for 90 sec, after which a desired thickness of 10 μm was confirmed. An exposure process was performed using a light source at 248 nm, followed by a baking process at 110° C. for 80 sec and then a development process using 2.38% tetramethylammonium hydroxide, thus forming a pattern. The pattern thus formed was confirmed to be a pattern having a sensitivity of 97 mJ/cm², a line/space resolution of 3.0 μm, and a pattern slope angle of 85°, and thus an approximately vertical slope.

Example 3

A positive photoresist composition for a KrF excimer laser was prepared by mixing 100 g of a phenol polymer resin having a weight average molecular weight of 15,000 (in Chemical Formula 5, $R_8$ is Chemical Formula a, $R_9$ is Chemical Formula c, and respective copolymerization ratios 1, m, and n are 7, 2, and 1) as a base resin, 25.0 g of a transmittance-increasing resin additive having a weight average molecular weight of 17,000 (in Chemical Formula 1, $R_1$, $R_2$, and $R_3$ are methyl, propyl, and butyl, respectively, and respective copolymerization ratios a, b, c, and d are 20, 50, 15, and 15), 4 g of triphenylsulfonium nonaflate as a photoacid generator, 0.6 g of triethanolamine as an acid diffusion inhibitor, and a solvent mixture comprising 129 g of propylene glycol monomethylether and 129 g of propylene glycol methyl ether acetate. The composition thus prepared was applied on a silicon wafer using a spin coater and soft-baked at 140° C. for 90 sec, after which a desired thickness of 10 μm was confirmed. An exposure process was performed using a light source at 248 nm, followed by a baking process at 110° C. for 80 sec and then a development process using 2.38% tetramethylammonium hydroxide, thus forming a pattern. The pattern thus formed was confirmed to be a pattern having a sensitivity of 91 mJ/cm², a line/space resolution of 2.5 μm, and a pattern slope angle of 87°, and thus an approximately vertical slope.

Example 4

A positive photoresist composition for a KrF excimer laser was prepared by mixing 100 g of a phenol polymer resin having a weight average molecular weight of 15,000 (in Chemical Formula 5, $R_8$ is Chemical Formula a, $R_9$ is Chemical Formula c, and respective copolymerization ratios 1, m, and n are 7, 2, and 1) as a base resin, 50.0 g of a transmittance-increasing resin additive having a weight average molecular weight of 17,000 (in Chemical Formula 1, $R_1$, $R_2$, and $R_3$ are methyl, propyl, and butyl, respectively, and respective copolymerization ratios a, b, c, and d are 20, 50, 15, and 15), 4 g of triphenylsulfonium nonaflate as a photoacid generator, 0.6 g of triethanolamine as an acid diffusion inhibitor, and a solvent mixture comprising 154 g of propylene glycol monomethylether and 154 g of propylene glycol methyl ether acetate. The composition thus prepared was applied on a silicon wafer using a spin coater and soft-baked at 140° C. for 90 sec, after which a desired thickness of 10 μm was confirmed. An exposure process was performed under a light source of 248 nm, followed by a baking process at 110° C. for 80 sec and then a development process using 2.38% tetramethylammonium hydroxide, thus forming a pattern. The pattern thus formed was confirmed to be a pattern having a sensitivity of 80 mJ/cm², a line/space resolution of 2.0 μm, and a pattern slope angle of 90° and thus an approximately vertical slope.

Comparative Example 1

The same procedures as in Example 1 were performed, with the exception that the transmittance-increasing resin additive was not added. The resulting pattern was confirmed to be a positive slope pattern having a sensitivity of 110 mJ/cm², a line/space resolution of 3.5 μm, and a pattern slope angle of 70°.

Measurement of Properties

The properties of the chemically amplified positive photoresist compositions prepared in Examples 1 to 4 and Comparative Example 1 were measured.

The resolution was determined by measuring an L/S (Line, Space) minimum line width (resolution) using a critical-dimension scanning electron microscope (CD-SEM) for observing a pattern line width (critical dimension). Also, the energy at which it became possible to determine the minimum line width (resolution) was measured and taken as the sensitivity.

The results of measurement thereof are shown in Table 1 below.

TABLE 1

|  | Sensitivity (mJ/cm²) | Resolution (μm) | Pattern Angle (°) | Defect |
|---|---|---|---|---|
| Example 1 | 100 | 3.5 | 75 | Free |
| Example 2 | 97 | 3.0 | 85 | Free |
| Example 3 | 91 | 2.5 | 87 | Free |
| Example 4 | 80 | 2.0 | 90 | Free |
| Comparative Example 1 | 110 | 3.5 | 74 | Scum, Residue |

As is apparent from Table 1, Examples 2 and 3 exhibited superior sensitivity compared to Comparative Example 1, and the resolution, which is the minimum line width, and the vertical pattern slope were also improved. However, in the case of Example 1, when compared to Comparative Example 1, the improvement in resolution and vertical pattern slope was insufficient, and in the case of Example 4, when compared to Comparative Example 1, the sensitivity, the resolution, which is the minimum line width, and the vertical pattern slope were improved, but defects such as scum, residue and the like were observed.

In conclusion, it is confirmed that, when the transmittance-increasing resin additive having the structure of Chemical Formula 1 is contained in an optimal amount, a photoresist composition for a KrF light source capable of improving the sensitivity and transmittance of a formed pattern and thus exhibiting a vertical profile compared to a conventional KrF positive photoresist can be provided.

All simple modifications or variations of the present disclosure may be easily performed by those skilled in the art, and fall within the scope of the present disclosure.

The invention claimed is:
1. A chemically amplified positive photoresist composition for improving a pattern profile, suitable for use in a photoresist enabling exposure using a light source having a wavelength of 248 nm, comprising, based on a total weight of the composition, 5 to 60 wt % of a polymer resin, 0.1 to 10 wt % of a transmittance-increasing resin additive consisting of Chemical Formula 1 below, 0.05 to 10 wt % of a photoacid generator, 0.01 to 5 wt % of an acid diffusion inhibitor, and a remainder of a solvent:

[Chemical Formula 1]

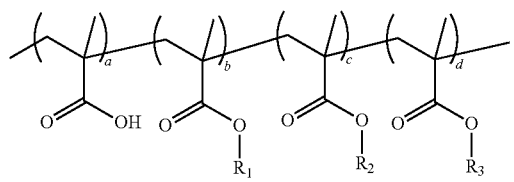

wherein a, b, c, and d are molar ratios of repeating units constituting a copolymer and are each 1 to 9, in which $R_1$, $R_2$, and $R_3$ are at least one selected from among methyl (R—$CH_3$), ethyl (R—$CH_2CH_3$), propyl (R—$CH_2CH_2CH_3$), butyl (R—$CH_2CH_2CH_2CH_3$) and combinations thereof, and are different from each other, R being a binding site, and wherein the polymer resin is at least one selected from the group consisting of hydroxyl-group-containing phenol polymer resins represented by Chemical Formula 2 to Chemical Formula 5 below:

[Chemical Formula 2]
resin comprising

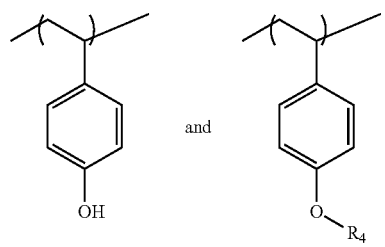

repeating units,
wherein $R_4$ is any one structure selected from among structures represented by Chemical Formula a to Chemical Formula p below, and R is a binding site,

[Chemical Formula a]

[Chemical Formula b]

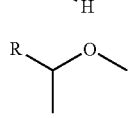

[Chemical Formula c]

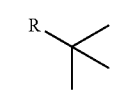

[Chemical Formula d]

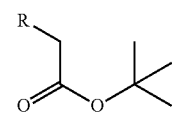

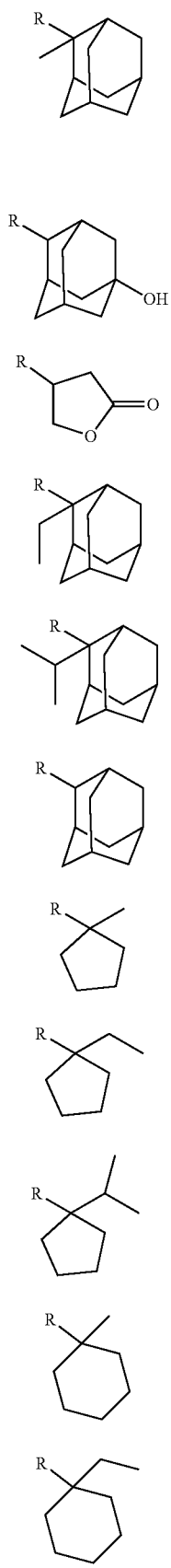

[Chemical Formula e]

[Chemical Formula f]

[Chemical Formula g]

[Chemical Formula h]

[Chemical Formula i]

[Chemical Formula j]

[Chemical Formula k]

[Chemical Formula l]

[Chemical Formula m]

[Chemical Formula n]

[Chemical Formula o]

[Chemical Formula p]

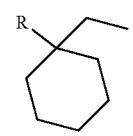

[Chemical Formula 3]
resin comprising

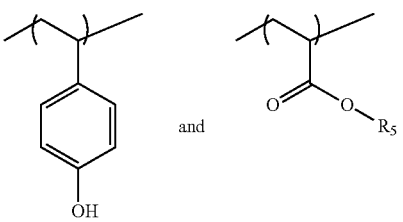

repeating units,
wherein $R_5$ is identical to $R_4$ and is any one structure selected from among structures represented by Chemical Formula a to Chemical Formula p,

[Chemical Formula 4]
resin comprising

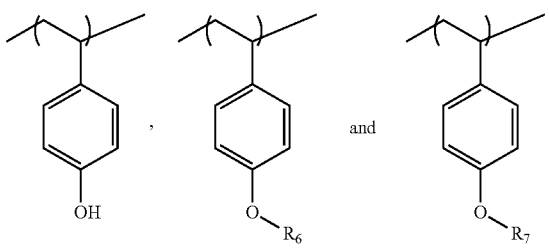

repeating units,
wherein $R_6$ and $R_7$ are one or more structures selected from among structures represented by Chemical Formula a to Chemical Formula p, and

[Chemical Formula 5]
resin comprising

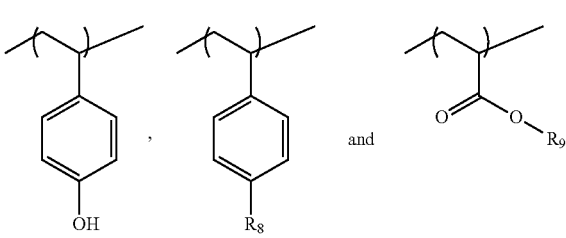

repeating units,
wherein $R_8$ and $R_9$ are one or more structures selected from among structures represented by Chemical Formula a to Chemical Formula p.

2. The chemically amplified positive photoresist composition of claim 1, wherein the transmittance-increasing resin additive represented by Chemical Formula 1 has a weight average molecular weight of 2,000 to 20,000.

3. The chemically amplified positive photoresist composition of claim 1, wherein the photoacid generator comprises at least one selected from the group consisting of triphenylsulfonium triflate, triphenylsulfonium antimonate, diphenyliodonium triflate, diphenyliodonium antimonate, methoxydiphenyliodonium triflate, 2,6-dinitrobenzylsulfonate, pyrogallol tris(alkyl sulfonate), norbornene dicarboxyimide triflate, triphenylsulfonium nonaflate, diphenyliodonium nonaflate, methoxydiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, N-hydroxysuccinimide perfluorooctane sulfonate, and norbornene dicarboxyimide perfluorooctane sulfonate.

4. The chemically amplified positive photoresist composition of claim 1, wherein the acid diffusion inhibitor comprises at least one selected from the group consisting of dimethylamine, diethylamine, trimethylamine, triethylamine, tributylamine, dimethanolamine, diethanolamine, trimethanolamine, triethanolamine, and tributanolamine.

* * * * *